US012527203B2

(12) United States Patent
Yamanaka et al.

(10) Patent No.: US 12,527,203 B2
(45) Date of Patent: Jan. 13, 2026

(54) DISPLAY DEVICE WITH WIRING LINES OVERLAPPING IMAGE CAPTURING AREA

(71) Applicant: SHARP KABUSHIKI KAISHA, Sakai (JP)

(72) Inventors: Masaki Yamanaka, Sakai (JP); Masahiko Miwa, Sakai (JP); Takao Saitoh, Sakai (JP); Yohsuke Kanzaki, Sakai (JP); Yi Sun, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 804 days.

(21) Appl. No.: 17/792,021

(22) PCT Filed: Jan. 28, 2020

(86) PCT No.: PCT/JP2020/002861
§ 371 (c)(1),
(2) Date: Jul. 11, 2022

(87) PCT Pub. No.: WO2021/152682
PCT Pub. Date: Aug. 5, 2021

(65) Prior Publication Data
US 2023/0050052 A1    Feb. 16, 2023

(51) Int. Cl.
*H10K 59/80* (2023.01)
*H10K 59/131* (2023.01)
*H10K 59/35* (2023.01)
*H10K 59/65* (2023.01)

(52) U.S. Cl.
CPC ..... *H10K 59/80516* (2023.02); *H10K 59/131* (2023.02); *H10K 59/353* (2023.02); *H10K 59/65* (2023.02); *H10K 59/873* (2023.02); *H10K 59/80518* (2023.02); *H10K 59/8731* (2023.02)

(58) Field of Classification Search
CPC .......... H10K 59/80516; H10K 59/353; H10K 59/131; H10K 59/65; H10K 59/873; H10K 59/8731; H10K 59/80518; H01K 50/818
See application file for complete search history.

(56) References Cited

U.S. PATENT DOCUMENTS

2019/0051859 A1    2/2019  Choi et al.
2019/0081118 A1*   3/2019  Oh ........................ H10K 59/10
2020/0133040 A1*   4/2020  Bang .................... G02F 1/1333

FOREIGN PATENT DOCUMENTS

JP    2019-035950 A    3/2019

* cited by examiner

*Primary Examiner* — Lex H Malsawma
(74) *Attorney, Agent, or Firm* — ScienBiziP, P.C.

(57) ABSTRACT

A display device includes: a display panel including: a base substrate; a thin film transistor layer provided on the base substrate and including a semiconductor layer, a gate insulation film, a plurality of first wiring lines, an interlayer insulation film, and a plurality of second wiring lines, all of which are stacked in a stated order; a light-emitting element layer provided on the thin film transistor layer; and a sealing film provided on the light-emitting element layer; and an image capturing unit provided on a base substrate side of the display area of the display panel, wherein in a plan view, the plurality of second wiring lines, in an area overlapping the image capturing unit, have portions respectively overlapping the plurality of first wiring lines.

11 Claims, 10 Drawing Sheets

DISPLAY DEVICE WITH WIRING LINES OVERLAPPING IMAGE CAPTURING AREA

TECHNICAL FIELD

The disclosure relates to display devices.

BACKGROUND ART

The organic EL display device, or the self-luminous display device built around organic electroluminescence (may be referred to as "EL" in the following) elements, has been attracting attention as an alternative to the liquid crystal display device. In such an organic EL display device, a structure is proposed that includes insular non-display areas and through holes extending thickness-wise through the non-display areas so that electronic components such as a camera and/or a fingerprint sensor can be provided inside a display area where there is produced an image display.

For instance, Patent Literature 1 discloses an electronic device including: a display panel having, in a display area, a module hole extending through the front and rear faces of a base substrate; and an electronic module housed in the module hole.

CITATION LIST

Patent Literature

Patent Literature 1: Japanese Unexamined Patent Application Publication, Tokukai, No. 2019-35950

SUMMARY

Technical Problem

Meanwhile, in the organic EL display device including a camera or like image capturing unit, a structure is proposed that includes an image capturing unit on the rear side of the display panel so that the image capturing unit can capture an image on the front side of the display panel through the display panel. However, in the organic EL display device with such a structure, the display panel is susceptible to insufficient optical transmittance, hence likely capturing dark images through the display panel. There is room for improvement.

In view of the foregoing problems, it is an object of the disclosure to improve the optical transmittance of the area in which an image capturing unit is provided.

Solution to Problem

To achieve the above object, a display device in accordance with the disclosure includes: a display panel including: a base substrate; a thin film transistor layer provided on the base substrate and including a semiconductor layer, a gate insulation film, a plurality of first wiring lines, an interlayer insulation film, and a plurality of second wiring lines, all of which are stacked in a stated order; a light-emitting element layer provided on the thin film transistor layer and including a plurality of first electrodes, a plurality of functional layers, and a second electrode that is common, all of which are stacked in a stated order, in a manner corresponding to a plurality of subpixels included in a display area; and a sealing film provided on the light-emitting element layer; and an image capturing unit provided on a base substrate side of the display area of the display panel, wherein in a plan view, the plurality of second wiring lines, in an area overlapping the image capturing unit, have portions respectively overlapping the plurality of first wiring lines.

Advantageous Effects of Disclosure

According to the disclosure, in a plan view, the plurality of second wiring lines, in an area overlapping the image capturing unit, have portions respectively overlapping the plurality of first wiring lines. Therefore, the optical transmittance of the area in which the image capturing unit is provided can be improved.

DESCRIPTION OF EMBODIMENTS

The following will describe embodiments of the disclosure in detail with reference to drawings. Note that the disclosure is not limited to these embodiments.

First Embodiment

Figure 1:
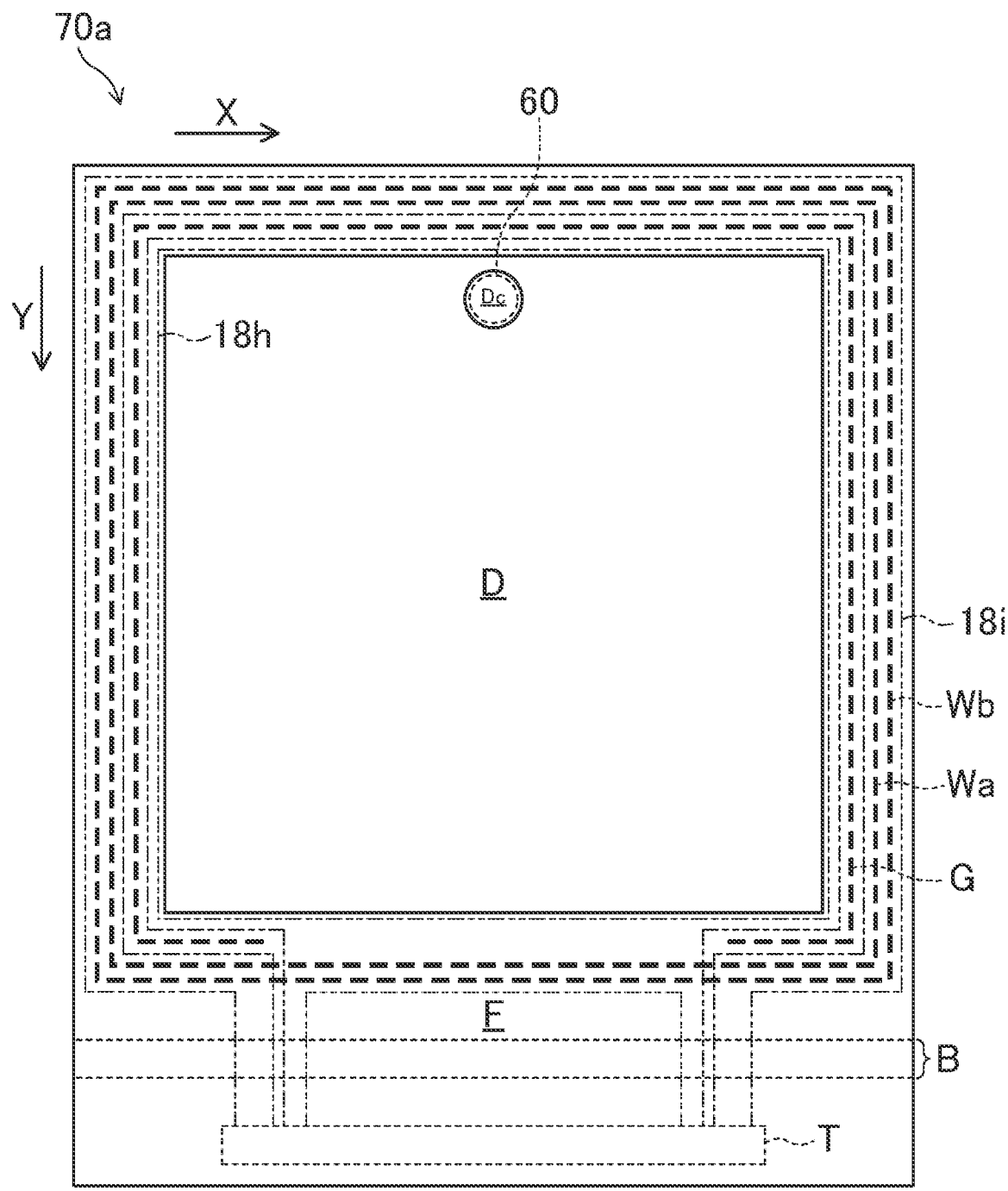
FIG. 1 is a schematic plan view of a structure of an organic EL display device in accordance with a first embodiment of the disclosure.
Figure 2:
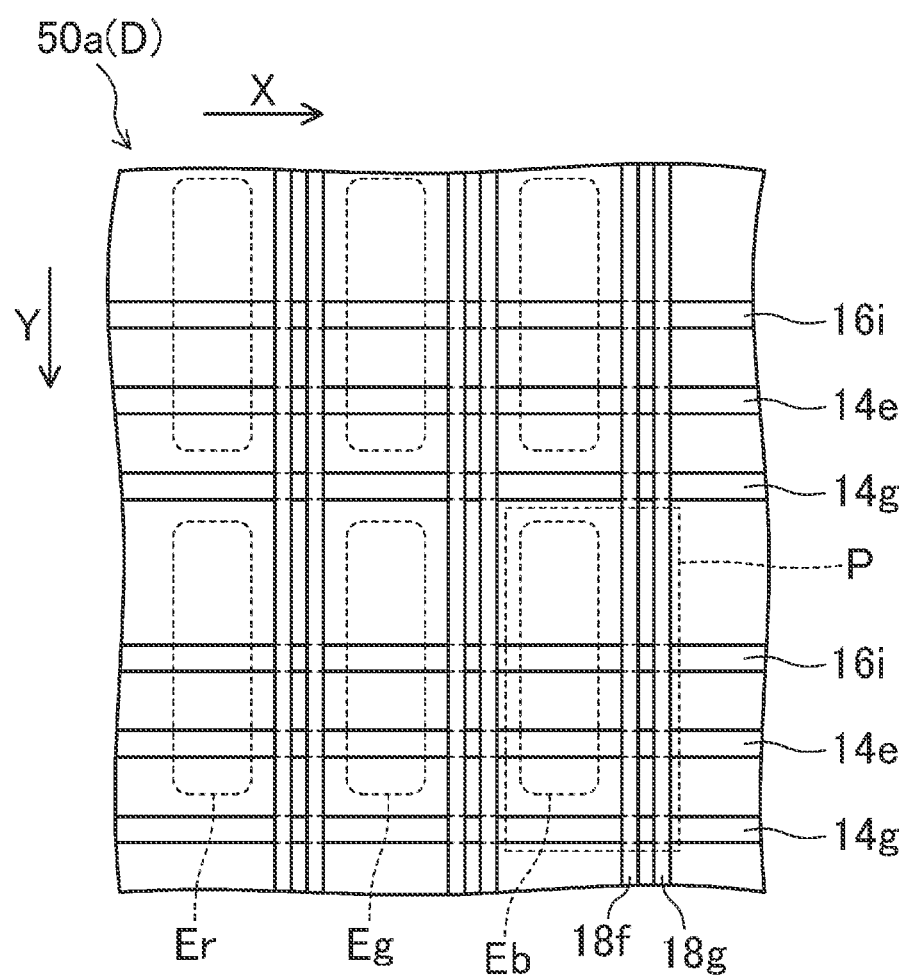
FIG. 2 is a plan view of a display area of an organic EL display panel in the organic EL display device in accordance with the first embodiment of the disclosure.
Figure 3:
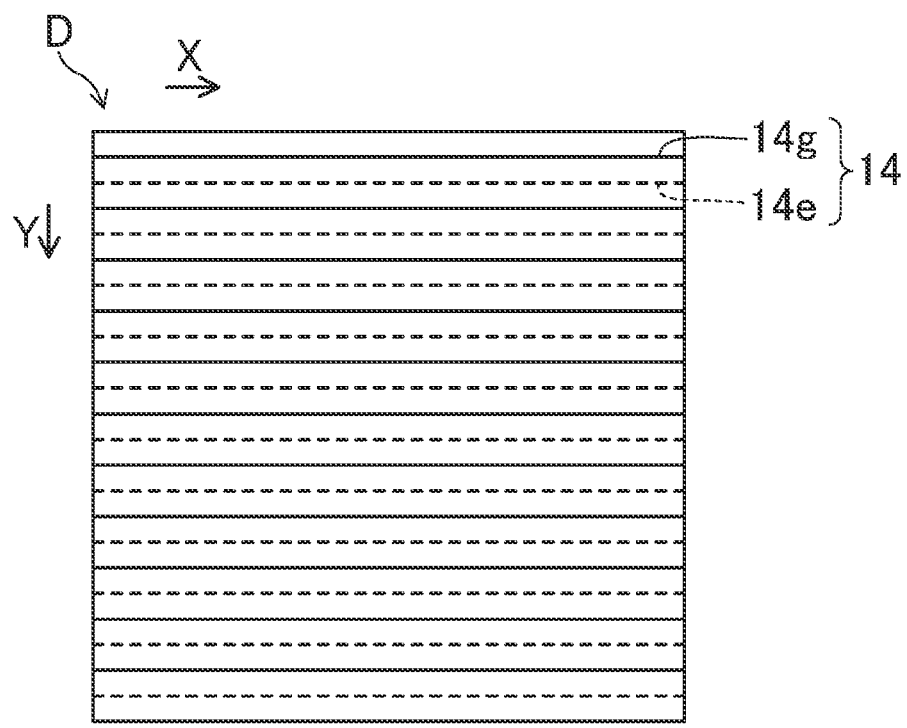
FIG. 3 is a plan view of a first wiring layer provided in the display area of the organic EL display panel in the organic EL display device in accordance with the first embodiment of the disclosure.
Figure 4:
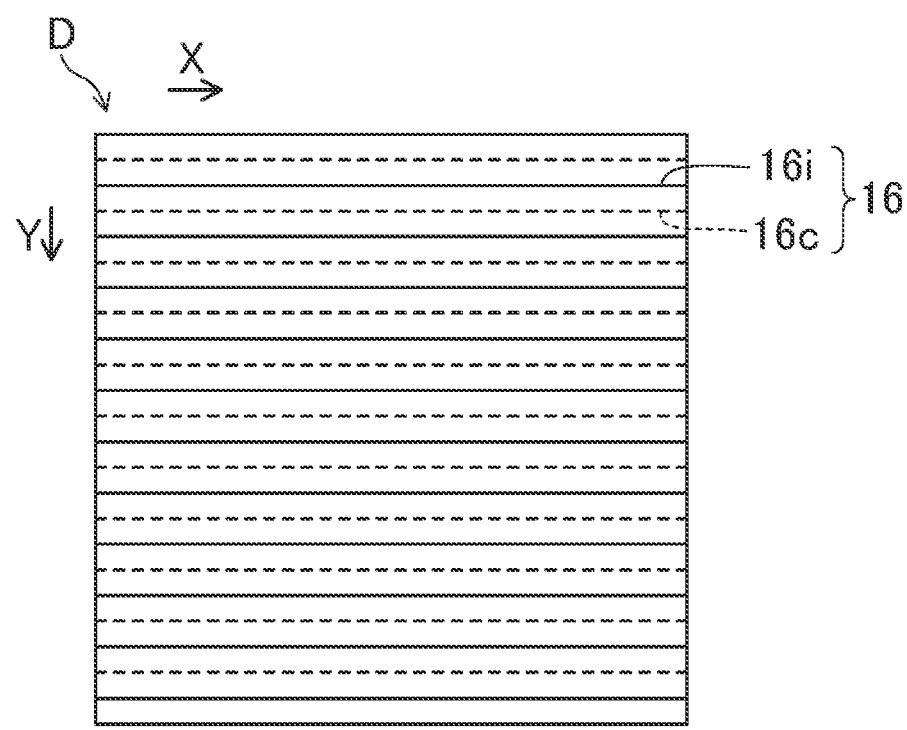
FIG. 4 is a plan view of a second wiring layer in the display area of the organic EL display panel in the organic EL display device in accordance with the first embodiment of the disclosure.
Figure 5:
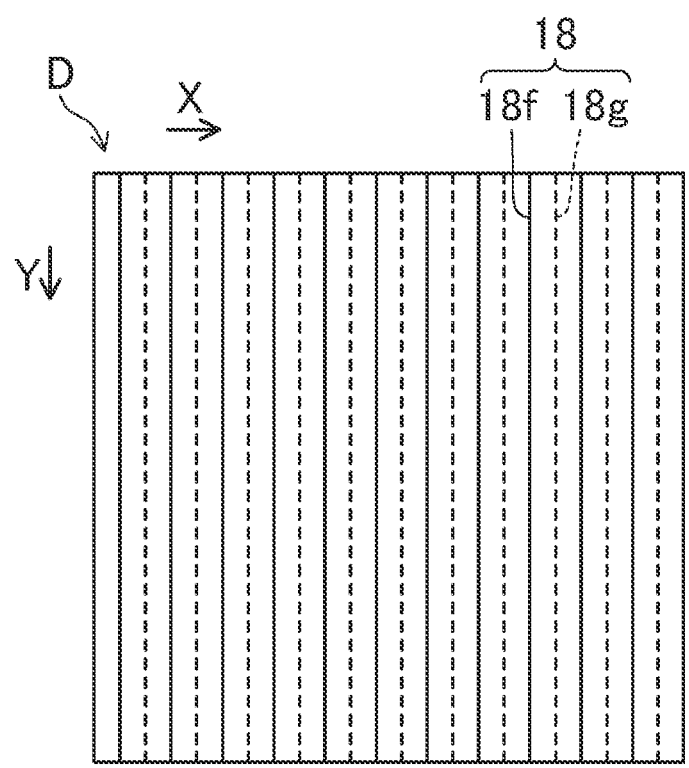
FIG. 5 is a plan view of a third wiring layer in the display area of the organic EL display panel in the organic EL display device in accordance with the first embodiment of the disclosure.
Figure 6:
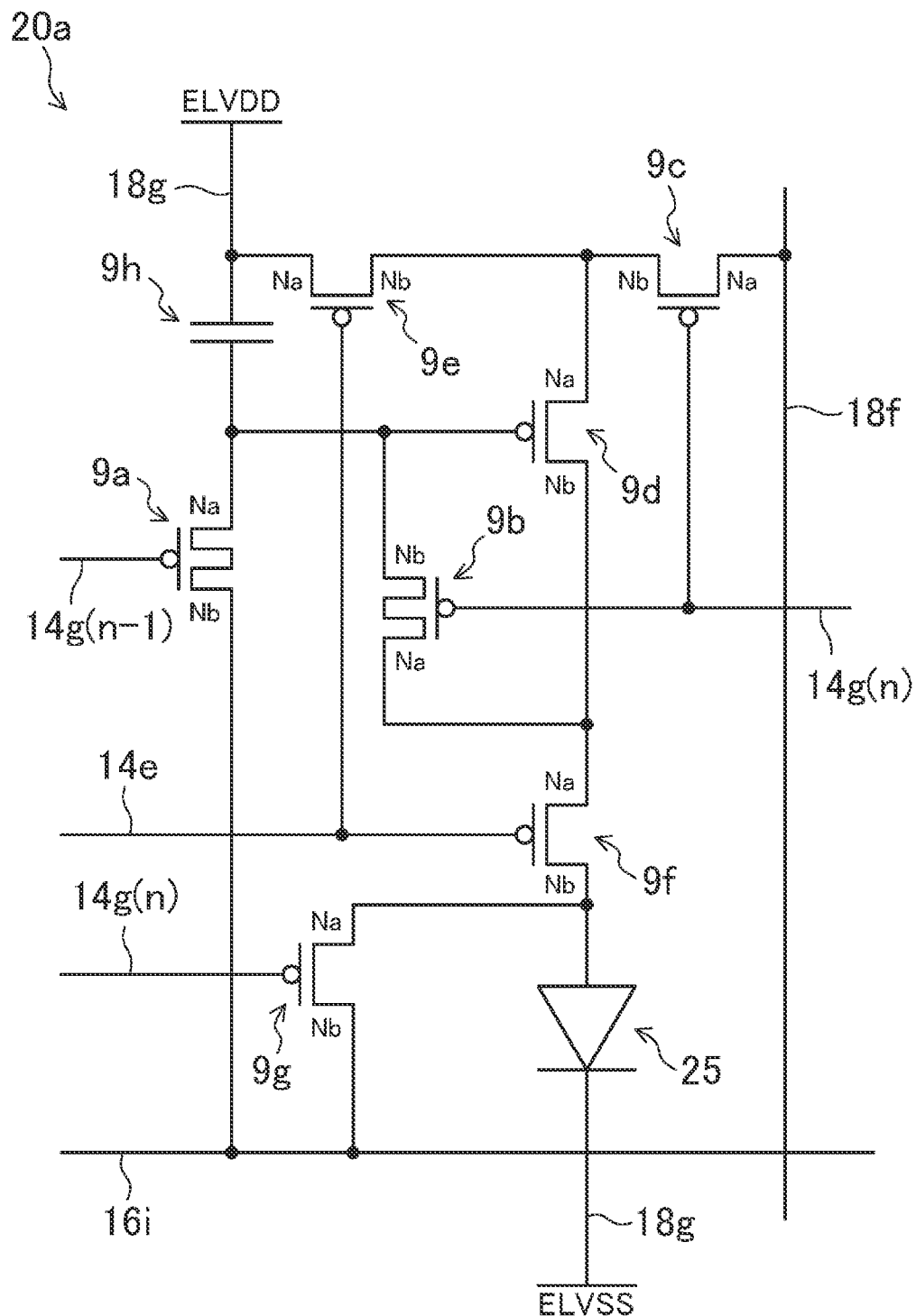
FIG. 6 is an equivalent circuit diagram of a TFT layer of the organic EL display panel in the organic EL display device in accordance with the first embodiment of the disclosure.
Figure 7:
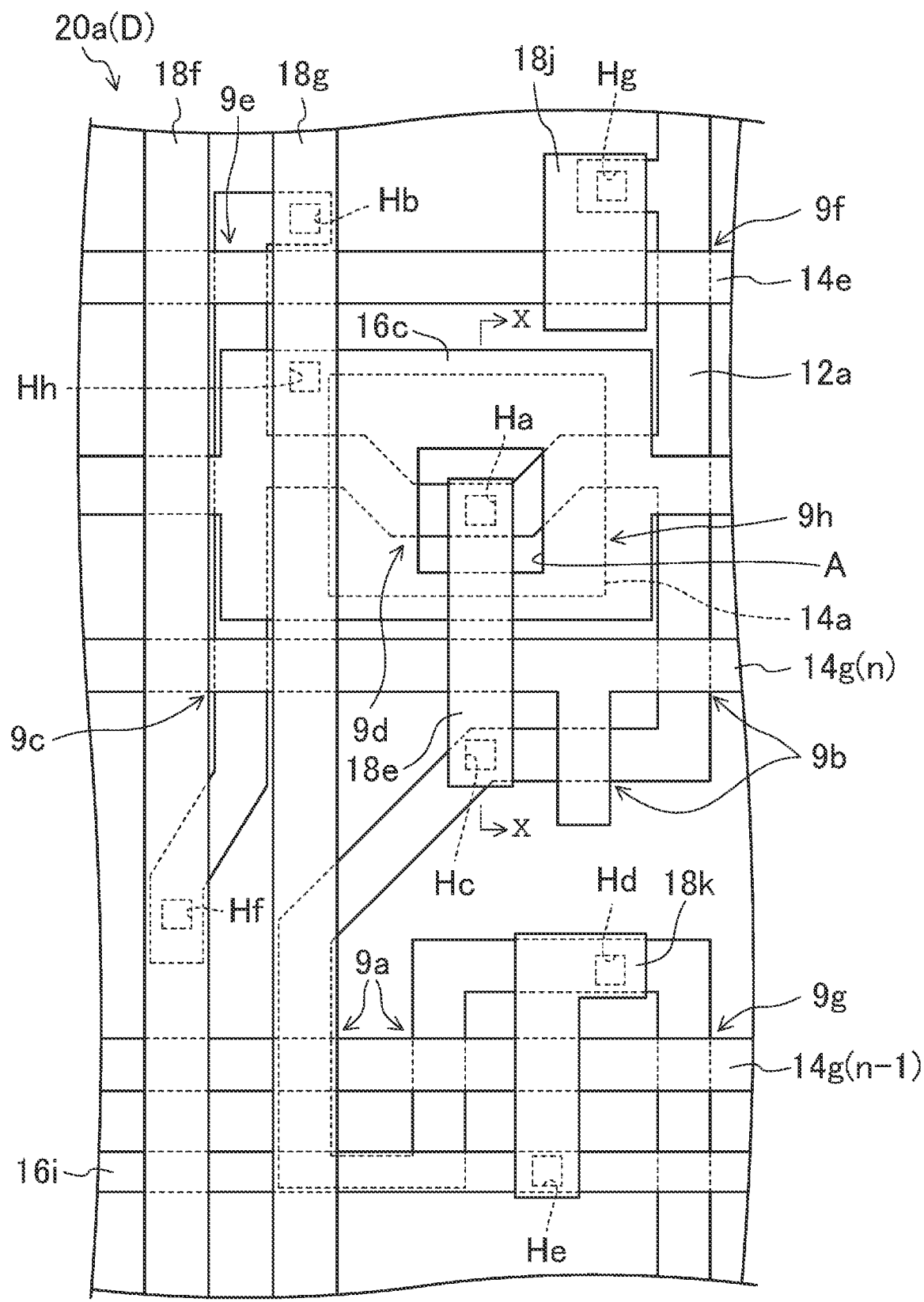
FIG. 7 is a plan view of a display area of the TFT layer of the organic EL display panel in the organic EL display device in accordance with the first embodiment of the disclosure.
Figure 8:
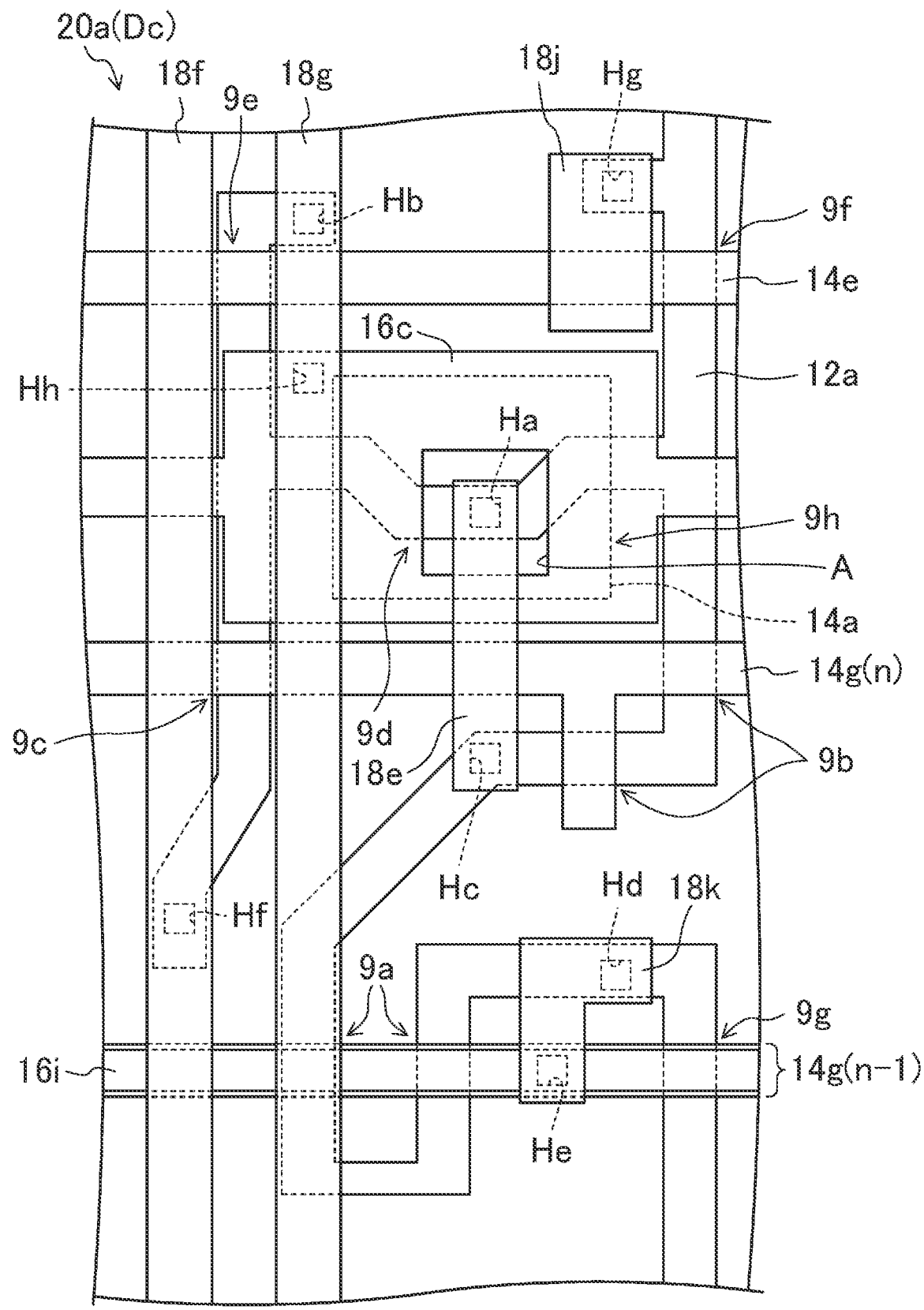
FIG. 8 is a plan view of an image capturing area of the TFT layer of the organic EL display panel in the organic EL display device in accordance with the first embodiment of the disclosure.
Figure 9:
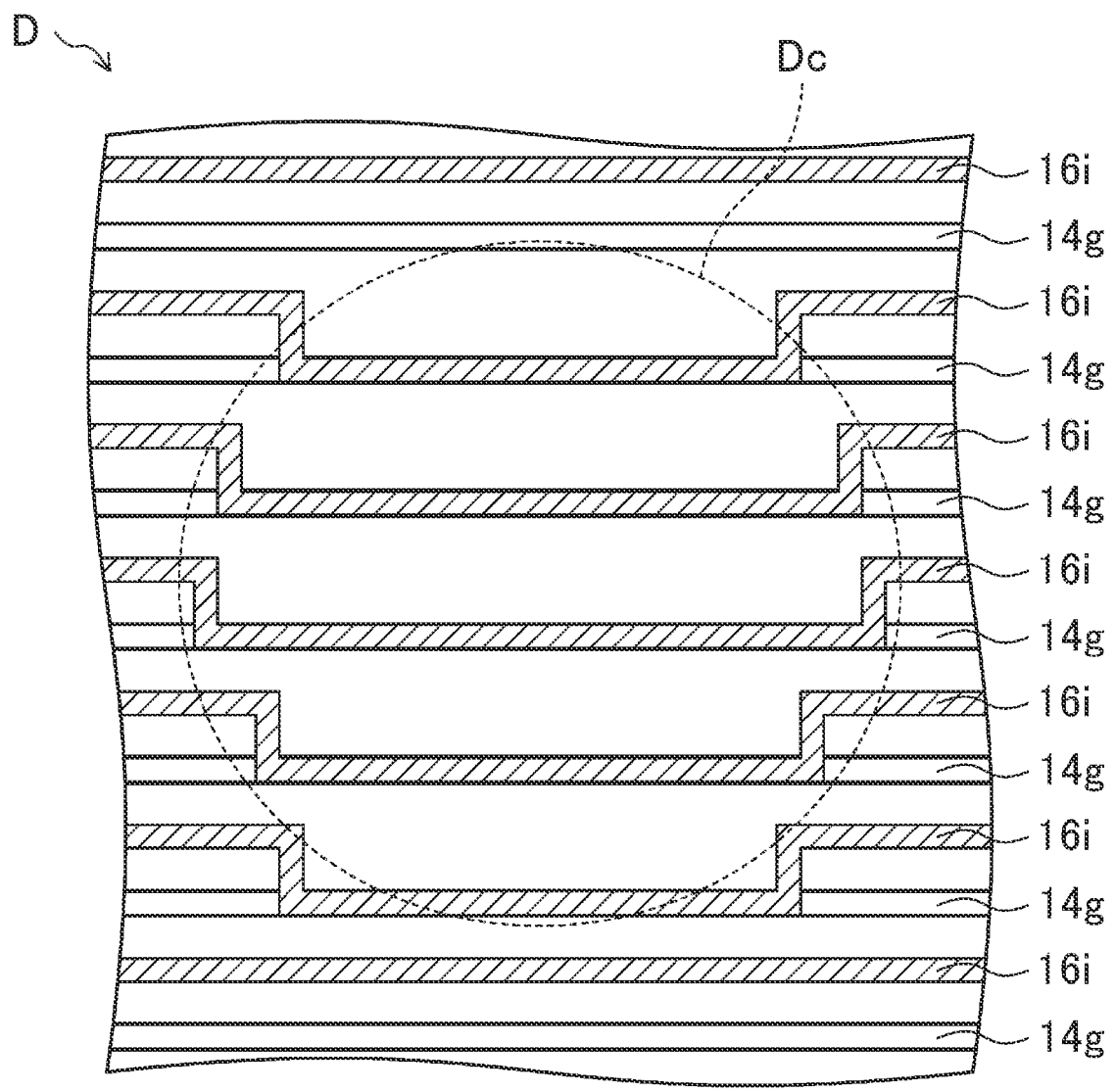
FIG. 9 is a schematic plan view of gate lines and initialization power supply lines in the TFT layer of the organic EL display panel in the organic EL display device in accordance with the first embodiment of the disclosure.
Figure 10:
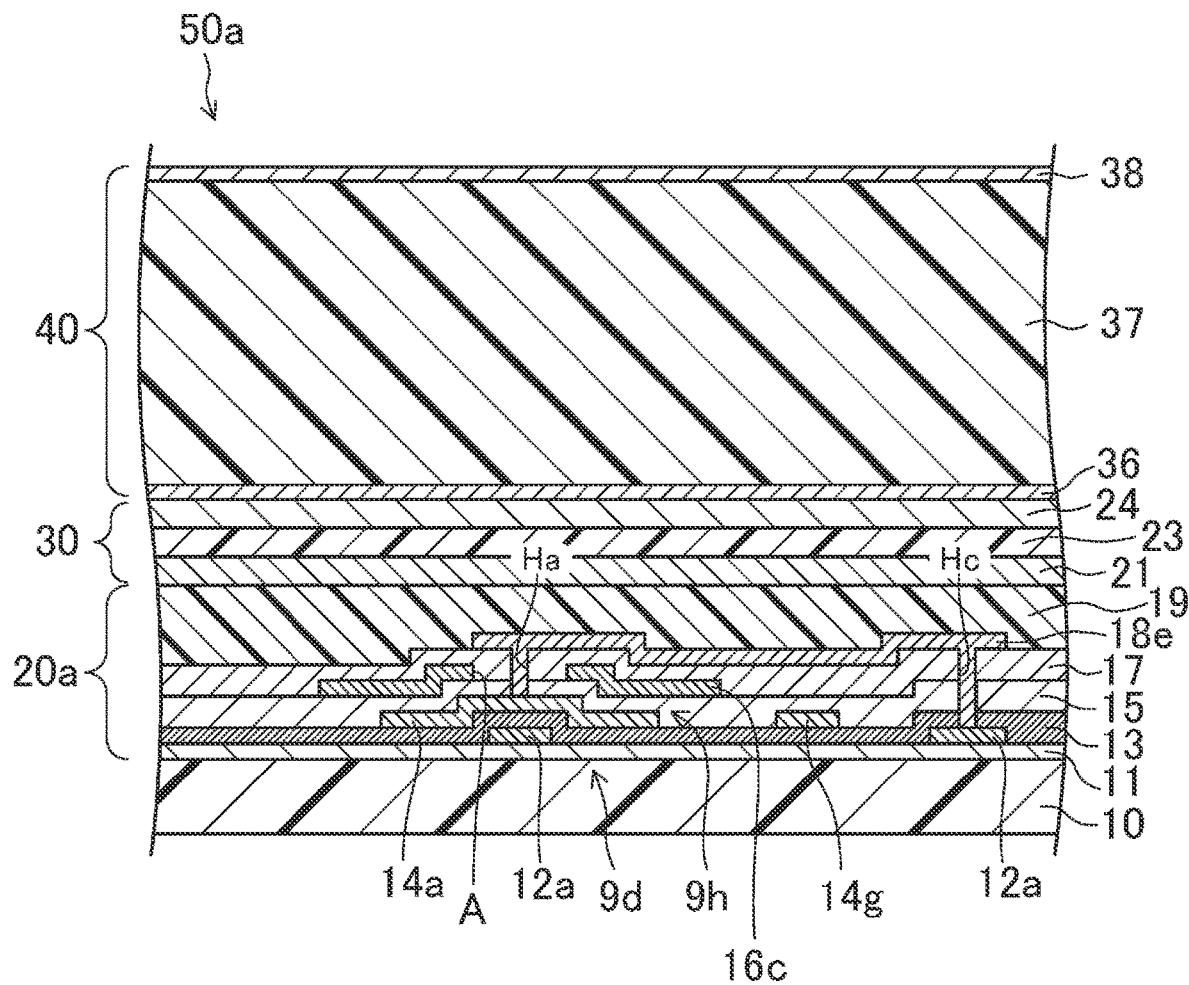
FIG. 10 is a cross-sectional view of the organic EL display panel in the organic EL display device taken along line X-X in FIG. 7.
Figure 11:
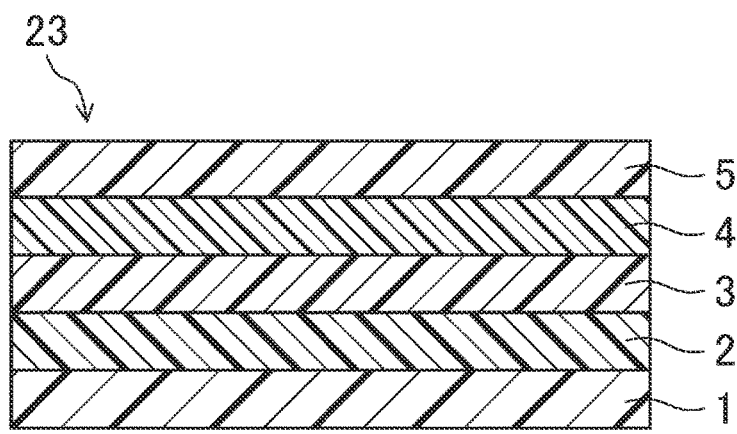
FIG. 11 is a cross-sectional view of an organic EL layer of the organic EL display panel in the organic EL display device in accordance with the first embodiment of the disclosure.

FIGS. 1 to 11 represent a first embodiment of the display device in accordance with the disclosure. Note that the following embodiments will discuss organic EL display devices including organic EL elements as an example of the display device including light-emitting elements. Here, FIG. 1 is a schematic plan view of a structure of an organic EL display device 70a in accordance with the present embodiment. In addition, FIG. 2 is a plan view of a display area D of an organic EL display panel 50a in the organic EL display device 70a. In addition, FIGS. 3, 4, and 5 are plan views of a first wiring layer 14, a second wiring layer 16, and a third wiring layer 18 in the display area D of the organic EL display panel 50a. In addition, FIG. 6 is an equivalent circuit diagram of a TFT layer 20a of the organic EL display panel 50a. In addition, FIG. 7 is a plan view of the display area D of the TFT layer 20a. In addition, FIG. 8 is a plan view of an image capturing area Dc of the TFT layer 20a. In addition, FIG. 9 is a schematic plan view of gate lines 14g and initialization power supply lines 16i in the TFT layer 20a. In addition, FIG. 10 is a cross-sectional view of the organic EL display panel 50a taken along line X-X in FIG. 7. In addition, FIG. 11 is a cross-sectional view of an organic EL layer 23 of the organic EL display panel 50a.

The organic EL display device 70a, as shown in FIG. 1 has, for example: the rectangular display area D for image displays; the image capturing area Dc, inside the display area D, for image displays and image capturing; and a frame area F shaped like a frame surrounding the display area D. Here, the organic EL display device 70a includes: the organic EL display panel 50a (detailed later); and an image capturing unit 60 (see FIG. 1) on a resin substrate layer 10 (detailed later) side of the image capturing area Dc of the organic EL display panel 50a. Note that the present embodiment describes the rectangular display area D as an example. This "rectangular" shape encompasses generally rectangular shapes including those with a curved side(s), those with a round corner(s), and those with a notched side(s). Additionally, the present embodiment describes the circular image capturing area Dc as an example. The image capturing area Dc may be shaped elliptical, polygonal, or otherwise. Also, the present embodiment describes a structure where the single image capturing area Dc is provided inside the display area D as an example. There may be provided a plurality of image capturing areas Dc inside the display area D. In addition, the image capturing unit 60 is, for example, a CMOS (complementary metal oxide semiconductor) camera or a CCD (charge coupled device) camera. In addition, the image capturing unit 60 is, as shown in FIG. 1, in a plan view, provided on an end region extending along the top side of the display area D in the drawing.

In the display area D, as shown in FIG. 2, there is provided a matrix of subpixels P. In the display area D are three provided, for example, subpixels P each of which includes a red-light-emission region Er for producing a red display, subpixels P each of which includes a green-light-emission region Eg for producing a green display, and subpixels P each of which includes a blue-light-emission region Eb for producing a blue display. Three subpixels, one from each of these three types of subpixels P, are arranged adjacent to each other as shown in FIG. 2. Note that in the display area D, a single pixel is composed of, as an example, three adjacent subpixels P that include one of the red-light-emission regions Er, one of the green-light-emission regions Eg, and one of the blue-light-emission regions Eb. Additionally, there are provided, for example, approximately 200 rows times 200 columns of subpixels P (=40,000 subpixels P) in the image capturing area Dc where the image capturing unit 60 is provided.

There is provided a terminal section T extending in one direction (X-direction in the drawing) in the bottom end portion of the frame area F in FIG. 1. In addition, in the frame area F, as shown in FIG. 1, a bending portion B that is bendable, for example, into 180° (a U-shape) about a bending axis, which is the X-direction in the drawing, is provided between the display area D and the terminal section T so as to extend in one direction (X-direction in the drawing). Also, in the frame area F, in a planarization film 19 (detailed later), as shown in FIG. 1, there is provided a trench G, generally C-shaped in a plan view, that runs through the planarization film 19. Here, the trench G is shaped generally like a letter C in such a manner that the trench G is open on the terminal section T side in a plan view as shown in FIG. 1.

The organic EL display panel 50a, as shown in FIG. 10, includes: the resin substrate layer 10 provided as a base substrate; the TFT layer 20a provided on the resin substrate layer 10; an organic EL element layer 30 provided as a light-emitting element layer on the TFT layer 20a; and a sealing film 40 provided on the organic EL element layer 30.

The resin substrate layer 10 is composed of, for example, polyimide resin.

The TFT layer 20a, as shown in FIG. 10, includes a base coat film 11, a plurality of semiconductor layers 12a, a gate insulation film 13, the first wiring layer 14 (see FIG. 3), a first interlayer insulation film 15, the second wiring layer 16 (see FIG. 4), a second interlayer insulation film 17, the third wiring layer 18 (see FIG. 5), and the planarization film 19, all of which are stacked on the resin substrate layer 10 in the stated order. In addition, the TFT layer 20a, as shown in FIGS. 6 and 7, includes, on the base coat film 11 and for each subpixel P, a first initialization TFT 9a, a threshold-voltage compensation TFT 9b, a write control TFT 9c, a drive TFT 9d, a power supply TFT 9e, a light-emission control TFT 9f, a second initialization TFT 9g, and a capacitor 9h. In addition, the TFT layer 20a, as shown in FIGS. 2 and 3, includes the plurality of gate lines 14g provided on the gate insulation film 13 as first wiring lines included in the first wiring layer 14 so as to extend parallel to each other in the row direction (X-direction in the drawing) in the display area D. Furthermore, the TFT layer 20a, as shown in FIGS. 2 and 3, includes a plurality of light-emission control lines 14e provided on the gate insulation film 13 as the first wiring layer 14 so as to extend parallel to each other in the row direction (X-direction in the drawing) in the display area D. Note that the light-emission control lines 14e are, as shown in FIGS. 2 and 3, disposed adjacent to the respective gate lines 14g. Additionally, the TFT layer 20a, as shown in FIGS. 2 and 4, includes the plurality of initialization power supply lines 16i provided on the first interlayer insulation film 15 as second wiring lines included in the second wiring layer 16 so as to extend parallel to each other in the row direction (X-direction in the drawing) in the display area D. Furthermore, the TFT layer 20a, as shown in FIGS. 2 and 4, includes a plurality of second power supply lines 16c provided on the first interlayer insulation film 15 as the second wiring layer 16 so as to extend parallel to each other in the row direction (X-direction in the drawing) in the display area D. Note that the second power supply lines 16c are, as shown in FIG. 4, disposed adjacent to the respective initialization power supply lines 16i. In addition, the TFT layer 20a, as shown in FIGS. 2 and 5, includes a plurality of source lines 18f provided on the second interlayer insulation film 17 as third wiring lines included in the third wiring layer 18 so as to extend parallel to each other in the column direction (Y-direction in the drawing) in the display area D. Furthermore, the TFT layer 20a, as shown in FIGS. 2 and 5, includes a plurality of first power supply lines 18g provided on the second interlayer insulation film 17 as the third wiring layer 18 so as to extend parallel to each other in the column direction (Y-direction in the drawing) in the display area D. Note that the first power supply lines 18g are, as shown in FIGS. 2 and 5, disposed adjacent to the respective source lines 18f. Furthermore, the plurality of first power supply lines 18g and the plurality of second power supply lines 16c are, as shown in FIG. 7, electrically connected respectively via eighth contact holes Hh formed in the second interlayer insulation film 17 in the subpixels P. Here, the first wiring layer 14, the second wiring layer 16, and the third wiring layer 18 include, for example, a metal monolayer film of, for example, molybdenum (Mo), titanium (Ti), aluminum (Al), copper (Cu), or tungsten (W) or a metal stack-layer film of, for example, Mo (top layer)-Al (middle layer)-Mo (bottom layer), Ti—Al—Ti, Al (top layer)-Ti (bottom layer), Cu—Mo, or Cu—Ti. Additionally, the first wiring layer 14 and the second wiring layer 16 are preferably made of the same material. Note that the base coat film 11, the gate insulation film 13, the first interlayer insulation film 15, and the second interlayer insulation film 17 include, for example, a monolayer or stack-layer film of an inorganic insulation film(s) of, for example, silicon nitride, silicon oxide, and/or silicon oxynitride. In addition, the semiconductor layers 12a include, for example, a low-temperature polysilicon film or an In—Ga—Zn—O-based oxide semiconductor film. Additionally, the planarization film 19 and the edge cover (detailed later) are made of, for example, an organic resin material such as polyimide resin.

In a plan view, the plurality of initialization power supply lines 16i, as shown in FIGS. 8 and 9, have portions respectively overlapping the plurality of gate lines 14g in the image capturing area Dc. In addition, in a plan view, the plurality of initialization power supply lines 16i, as shown in FIG. 9, do not overlap the plurality of gate lines 14g respectively outside the image capturing area Dc. In other words, the initialization power supply line 16i, as shown in FIG. 9, is provided between a pair of adjacent ones of the gate lines 14g so as not to overlap the gate lines 14g outside the image capturing area Dc and provided so as to overlap the gate lines 14g in the image capturing area Dc. In addition, both end regions of those parts where the plurality of gate lines 14g and the plurality of initialization power supply lines 16i overlap each other respectively are, as shown in FIG. 9, provided along an edge of the image capturing area Dc. Here, each gate line 14g has a width that is, as shown in FIGS. 7, 8, and 9, larger than the width of each initialization power supply line 16i. Note that the present embodiment discusses, as an example, a structure where the width of each gate line 14g is larger than the width of each initialization power supply line 16i. However, the width of each gate line 14g may be smaller than the width of each initialization power supply line 16i.

The first initialization TFTs 9a, the threshold-voltage compensation TFTs 9b, the write control TFTs 9c, the drive TFTs 9d, the power supply TFTs 9e, the light-emission control TFTs 9f, and the second initialization TFTs 9g each include: a first terminal (see Na in FIG. 6) and a second terminal (see Nb in FIG. 6) that are positioned so as to be separated from each other; and a control terminal for controlling conduction between the first terminal and the second terminal. Note that the first and second terminals of each TFT 9a to 9g are conductive regions of the semiconductor layer 12a.

The first initialization TFT 9a, as shown in FIG. 6, has, in each subpixel P, the control terminal thereof electrically connected to an associated one of the gate lines 14g, the first terminal thereof electrically connected to a gate electrode 14a of one of the capacitors 9h (detailed later), and the second terminal thereof electrically connected to an associated one of the initialization power supply lines 16i. Note that the control terminal of the first initialization TFT 9a is, as shown in FIG. 7, the two parts of the gate line 14g that overlap the semiconductor layer 12a (one part in the image capturing area Dc in FIG. 8). In addition, the first terminal of the first initialization TFT 9a is, as shown in FIGS. 7 and 10, electrically connected to the gate electrode 14a of the capacitor 9h via a third contact hole Hc formed through the gate insulation film 13, the first interlayer insulation film 15, and the second interlayer insulation film 17, via a third connection wiring line 18e, and via a first contact hole Ha formed through the first interlayer insulation film 15 and the second interlayer insulation film 17. In addition, the second terminal of the first initialization TFT 9a is, as shown in FIG. 7, electrically connected to the initialization power supply line 16i via a fourth contact hole Hd formed through the gate insulation film 13, the first interlayer insulation film 15, and the second interlayer insulation film 17, via a fourth connection wiring line 18k, and via a fifth contact hole He formed through the second interlayer insulation film 17. Here, the first initialization TFT 9a is arranged so as to initialize the voltage applied to the control terminal of the drive TFT 9d by applying the voltage on the initialization power supply line 16i to the capacitor 9h. Note that the first initialization TFT 9a is electrically connected to a gate line 14g(n−1) that is driven immediately prior to a gate line 14g(n) electrically connected to each control terminal of the threshold-voltage compensation TFT 9b and the write control TFT 9c.

The threshold-voltage compensation TFT 9b, as shown in FIG. 6, has, in each subpixel P, the control terminal thereof electrically connected to an associated one of the gate lines 14g, the first terminal thereof electrically connected to the second terminal of the drive TFT 9d, and the second terminal thereof electrically connected to the control terminal of the drive TFT 9d. Note that the control terminal of the threshold-voltage compensation TFT 9b is, as shown in FIG. 7, the two parts of the gate line 14g that overlap the semiconductor layer 12a. In addition, the first terminal of the threshold-voltage compensation TFT 9b is, as shown in FIG. 7, provided integral to the second terminal of the drive TFT 9d and electrically connected to the second terminal of the drive TFT 9d. In addition, the second terminal of the threshold-voltage compensation TFT 9b is, as shown in FIG. 7, electrically connected to the gate electrode 14a of the drive TFT 9d via the third contact hole Hc, the third connection wiring line 18e, and the first contact hole Ha. Here, the threshold-voltage compensation TFT 9b is arranged so as to compensate the threshold voltage of the drive TFT 9d by turning the drive TFT 9d into a diode-connected state in accordance with the selection of the gate line 14g.

The write control TFT 9c, as shown in FIG. 6, has, in each subpixel P, the control terminal thereof electrically connected to an associated one of the gate lines 14g, the first terminal thereof electrically connected to an associated one of the source lines 18f, and the second terminal thereof electrically connected to the first terminal of the drive TFT 9d. Note that the control terminal of the write control TFT 9c is, as shown in FIG. 7, a part of the gate line 14g that overlaps the semiconductor layer 12a. In addition, the first terminal of the write control TFT 9c is, as shown in FIG. 7, electrically connected to the source line 18f via a sixth contact hole Hf formed through the gate insulation film 13, the first interlayer insulation film 15, and the second interlayer insulation film 17. In addition, the second terminal of the write control TFT 9c is, as shown in FIG. 7, provided integral to the first terminal of the drive TFT 9d and electrically connected to the first terminal of the drive TFT 9d. Here, the write control TFT 9c is arranged so as to apply the voltage on the source line 18f to the first terminal of the drive TFT 9d in accordance with the selection of the gate line 14g.

The drive TFT 9d, as shown in FIG. 6, has, in each subpixel P, the control terminal thereof electrically connected to the first terminal of the first initialization TFT 9a and the second terminal of the threshold-voltage compensation TFT 9b, the first terminal thereof electrically connected to the second terminal of the write control TFT 9c and the second terminal of the power supply TFT 9e, and the second terminal thereof electrically connected to the first terminal of the threshold-voltage compensation TFT 9b and the first terminal of the light-emission control TFT 9f. Here, the drive TFT 9d is arranged so as to control the amount of current of an organic EL element 25 by applying, to the first terminal of the light-emission control TFT 9f, a drive current in accordance with the voltage applied across the control terminal thereof and the first terminal thereof.

More specifically, the drive TFT 9d, as shown in FIGS. 7 and 10, includes the semiconductor layer 12a, the gate insulation film 13, the gate electrode (control terminal) 14a, the first interlayer insulation film 15, and the second interlayer insulation film 17, all of which are provided on the base coat film 11 in the stated order. Here, the semiconductor layer 12a is, as shown in FIGS. 7 and 10, provided with an angle on the base coat film 11. In addition, the semiconductor layer 12a includes: an intrinsic region provided so as to overlap the gate electrode 14a in a plan view; and a pair of conductive regions provided so as to sandwich the intrinsic region. Note that this intrinsic region, as shown in FIG. 7, has a middle portion thereof that is shaped generally like a letter V in a plan view. In addition, one of the conductive regions of the semiconductor layer 12a is provided as the first terminal and is, as shown in FIG. 7, formed integral to the second terminal of the write control TFT 9c and the second terminal of the power supply TFT 9e and electrically connected to the second terminal of the write control TFT 9c and the second terminal of the power supply TFT 9e. In addition, the other conductive region of the semiconductor layer 12a is provided as the second terminal and is, as shown in FIG. 7, formed integral to the first terminal of the threshold-voltage compensation TFT 9b and the first terminal of the light-emission control TFT 9f and electrically connected to the first terminal of the threshold-voltage compensation TFT 9b and the first terminal of the light-emission control TFT 9f. In addition, the gate insulation film 13 is, as shown in FIG. 10, provided so as to cover the semiconductor layer 12a. In addition, the gate electrode 14a is, as shown in FIGS. 7 and 10, provided on the gate insulation film 13 as the first wiring layer 14 in a rectangular insular manner in a plan view so as to overlap the intrinsic region of the semiconductor layer 12a. In addition, the first interlayer insulation film 15 is, as shown in FIG. 10, provided so as to cover the gate electrode 14a. In addition, the second interlayer insulation film 17 is, as shown in FIG. 10, provided on the first interlayer insulation film 15 with the second power supply line 16c intervening therebetween.

The power supply TFT 9e, as shown in FIG. 6, has, in each subpixel P, the control terminal thereof electrically connected to an associated one of the light-emission control lines 14e, the first terminal thereof electrically connected to an associated one of to the first power supply lines 18g, and the second terminal thereof electrically connected to the first terminal of the drive TFT 9d. Note that the control terminal of the power supply TFT 9e is, as shown in FIG. 7, a part of the light-emission control line 14e that overlaps the semiconductor layer 12a. In addition, the first terminal of the power supply TFT 9e is, as shown in FIG. 7, electrically connected to the first power supply line 18g via a second contact hole Hb formed through the gate insulation film 13, the first interlayer insulation film 15, and the second interlayer insulation film 17. In addition, the second terminal of the power supply TFT 9e is, as shown in FIG. 7, formed integral to the first terminal of the drive TFT 9d and electrically connected to the first terminal of the drive TFT 9d. Here, the power supply TFT 9e is arranged to apply the voltage on the first power supply line 18g to the first terminal of the drive TFT 9d in accordance with the selection of the light-emission control line 14e.

The light-emission control TFT 9f, as shown in FIG. 6, has, in each subpixel P, the control terminal thereof electrically connected to an associated one of the light-emission control lines 14e, the first terminal thereof electrically connected to the second terminal of the drive TFT 9d, and the second terminal thereof electrically connected to a first electrode 21 of the organic EL element 25 (detailed later). Note that the control terminal of the light-emission control TFT 9f is, as shown in FIG. 7, a part of the light-emission control line 14e that overlaps the semiconductor layer 12a. In addition, the first terminal of the light-emission control TFT 9f is, as shown in FIG. 7, formed integral to the second terminal of the drive TFT 9d and electrically connected to the second terminal of the drive TFT 9d. In addition, the second terminal of the light-emission control TFT 9f is, as shown in FIG. 7, electrically connected to the first electrode 21 of an organic EL element 25 via a seventh contact hole Hg formed through the gate insulation film 13, the first interlayer insulation film 15, and the second interlayer insulation film 17 and via a second connection wiring line 18j provided as a second wiring layer 18. Here, the light-emission control TFT 9f is arranged so as to apply the aforementioned drive current to the organic EL element 25 in accordance with the selection of the light-emission control line 14e.

The second initialization TFT 9g, as shown in FIG. 6, has, in each pixel P, the control terminal thereof electrically connected to an associated one of the gate lines 14g, the first terminal thereof electrically connected to the first electrode 21 of the organic EL element 25, and the second terminal thereof electrically connected to an associated one of the initialization power supply lines 16i. Note that the control terminal of the second initialization TFT 9g, is, as shown in FIG. 7, a part of the gate line 14g that overlaps the semiconductor layer 12a. In addition, the first terminal of the second initialization TFT 9g is, as shown in FIG. 7, formed integral to the second terminal of the light-emission control TFT 9f and electrically connected to the first electrode 21 of the organic EL element 25. In addition, the second terminal of the second initialization TFT 9g is, as shown in FIG. 7, electrically connected to the initialization power supply line 16i via the fourth contact hole Hd, the fourth connection wiring line 18k, and the fifth contact hole He. Here, the second initialization TFT 9g is arranged so as to reset the electric charge stored in the first electrode 21 of the organic EL element 25 in accordance with the selection of the gate line 14g.

Note that the TFTs 9a to 9g are top-gate TFTs as an example in the present embodiment, but may be bottom-gate TFTs.

The capacitor 9h, as shown in FIGS. 7 and 10, includes: the gate electrode 14a; the first interlayer insulation film 15 provided on the gate electrode 14a; and the second power supply line 16c provided on the first interlayer insulation film 15 so as to overlap the gate electrode 14a in a plan view. In addition, the capacitor 9h, as shown in FIGS. 6 and 7, has, in each subpixel P: the gate electrode 14a thereof formed integral to the gate electrode 14a of the drive TFT 9d and electrically connected to the first terminal of the first initialization TFT 9a and the second terminal of the threshold-voltage compensation TFT 9b; and the second power supply line 16c electrically connected to an associated one of the first power supply lines 18g via the eighth contact hole Hh formed through the second interlayer insulation film 17. Here, the capacitor 9h is arranged so as to maintain the voltage on the gate electrode 14a of the drive TFT 9d when the associated one of the gate lines 14g is not selected, by storing charge under the voltage on an associated one of the source lines 18f when an associated one of the gate lines 14g is selected and maintaining that stored voltage. In addition, the second power supply line 16c is, as shown in FIG. 7, provided reaching the outside of the peripheral end of the gate electrode 14a along the entire peripheral end of the gate electrode 14a. In addition, the second power supply line 16c has, as shown in FIGS. 7 and 10, a through hole A that overlaps the gate electrode 14a in a plan view and that extends through the second power supply line 16c. In addition, on the second power supply line 16c, as shown in FIG. 10, the second interlayer insulation film 17 is provided so as to cover the second power supply line 16c. In addition, the gate electrode 14a is, as shown in FIGS. 7 and 10, electrically connected via the first contact hole Ha to the third connection wiring line 18e provided as the second wiring layer 18.

The organic EL element layer 30 includes a matrix of organic EL elements 25 and as shown in FIG. 10, includes a plurality of first electrodes 21, a plurality of organic EL layers 23, and a second electrode 24, all of which are stacked on the TFT layer 20a in the stated order.

The plurality of first electrodes 21 are, as shown in FIG. 10, provided in a matrix on the planarization film 19 so as to correspond to the plurality of subpixels P. Here, the first electrode 21 is, in each subpixel P, electrically connected to the second connection wiring line 18j via a contact hole formed through the planarization film 19. In addition, the first electrode 21 has a function of injecting holes to the organic EL layer 23. In addition, the first electrode 21 is more preferably made of a material that has a large work function in order to improve the efficiency of hole injection to the organic EL layer 23. Here, the first electrode 21 is made of, for example, a metal material such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), or tin (Sn). Alternatively, the first electrode 21 may be made of, for example, an alloy such as astatine-astatine oxide ((At)—AtO$_2$). Furthermore, the first electrode 21 may be made of, for example, an electrically conductive oxide such as tin oxide (SnO), zinc oxide (ZnO), indium tin oxide (ITO), or indium zinc oxide (IZO). In addition, the first electrode 21 may include a stack of layers of any of these materials. Note that examples of compound materials that have a large work function include indium tin oxide (ITO) and indium zinc oxide (IZO). In addition, the peripheral end portion of the first electrode 21 is covered with a lattice-shaped edge cover provided commonly to the plurality of subpixels P.

The plurality of organic EL layers 23 are, as shown in FIG. 10, disposed on the respective first electrodes 21 and provided in a matrix and as a functional layer so as to correspond to the plurality of subpixels P. Here, each organic EL layer 23, as shown in FIG. 11, includes a hole injection layer 1, a hole transport layer 2, an organic light-emitting layer 3, an electron transport layer 4, and an electron injection layer 5, all of which are stacked on the first electrode 21 in the stated order.

The hole injection layer 1 is alternatively referred to as the anode buffer layer and has a function of bringing the energy levels of the first electrode 21 and the organic EL layer 23 closer to each other to improve the efficiency of hole injection from the first electrode 21 to the organic EL layer 23. Here, the hole injection layer 1 is made of, for example, a triazole derivative, an oxadiazole derivative, an imidazole derivative, a polyaryl alkane derivative, a pyrazoline derivative, a phenylenediamine derivative, an oxazole derivative, a styryl anthracene derivative, a fluorenone derivative, a hydrazone derivative, or a stilbene derivative.

The hole transport layer 2 has a function of improving the efficiency of hole transport from the first electrode 21 to the organic EL layer 23. Here, the hole transport layer 2 is made of, for example, a porphyrin derivative, an aromatic tertiary amine compound, a styryl amine derivative, polyvinyl carbazole, poly-p-phenylene vinylene, polysilane, a triazole derivative, an oxadiazole derivative, an imidazole derivative, a polyaryl alkane derivative, a pyrazoline derivative, a pyrazolone derivative, a phenylenediamine derivative, an aryl amine derivative, an amine-substituted chalcone derivative, an oxazole derivative, a styryl anthracene derivative, a fluorenone derivative, a hydrazone derivative, a stilbene derivative, hydrogenated amorphous silicon, hydrogenated amorphous silicon carbide, zinc sulfide, or zinc selenide.

The organic light-emitting layer 3 is injected with holes and electrons from the first electrode 21 and the second electrode 24 respectively when the organic light-emitting layer 3 is under voltage applied by the first electrode 21 and the second electrode 24. These holes and electrons recombine in the organic light-emitting layer 3. Here, the organic light-emitting layer 3 is made of a material that has a high luminous efficiency. Then, the organic light-emitting layer 3 is made of, for example, a metal oxinoid compound (8-hydroxy quinoline metal complex), a naphthalene derivative, an anthracene derivative, a diphenyl ethylene derivative, a vinyl acetone derivative, a triphenyl amine derivative, a butadiene derivative, a coumarin derivative, a benzoxazole derivative, an oxadiazole derivative, an oxazole derivative, a benzimidazole derivative, a thiadiazole derivative, a benzothiazole derivative, a styryl derivative, a styryl amine derivative, a bis(styryl)benzene derivative, a tris(styryl)benzene derivative, a perylene derivative, a perynone derivative, an amino pyrene derivative, a pyridine derivative, a rhodamine derivative, an acridine derivative, phenoxazone, a quinacridone derivative, rubrene, poly-p-phenylene vinylene, or polysilane.

The electron transport layer 4 has a function of efficiently transporting electrons to the organic light-emitting layer 3. Here, the electron transport layer 4 is made of, for example, an organic compound such as an oxadiazole derivative, a triazole derivative, a benzoquinone derivative, a naphthoquinone derivative, an anthraquinone derivative, a tetracyanoanthraquinodimethane derivative, a diphenoquinone derivative, a fluorenone derivative, a silole derivative, or a metal oxinoid compound.

The electron injection layer 5 has a function of bringing the energy levels of the second electrode 24 and the organic EL layer 23 closer to each other to improve the efficiency of electron injection from the second electrode 24 to the organic EL layer 23. This function can lower the drive voltage of the organic EL element 25. Note that the electron injection layer 5 is alternatively referred to as the cathode buffer layer. Here, the electron injection layer 5 is made of, for example, an inorganic alkali compound such as lithium fluoride (LiF), magnesium fluoride ($MgF_2$), calcium fluoride ($CaF_2$), strontium fluoride ($SrF_2$), or barium fluoride ($BaF_2$); aluminum oxide ($Al_2O_3$); or strontium oxide (SrO).

The second electrode 24 is, as shown in FIG. 10, provided so as to cover the organic EL layers 23 and the edge cover commonly to the plurality of subpixels P. In addition, the second electrode 24 has a function of injecting electrons to the organic EL layers 23. In addition, the second electrode 24 is more preferably made of a material that has a small work function in order to improve the efficiency of electron injection to the organic EL layer 23. Here, the second electrode 24 is made of, for example, silver (Ag), aluminum (Al), vanadium (V), calcium (Ca), titanium (Ti), yttrium (Y), sodium (Na), manganese (Mn), indium (In), magnesium (Mg), lithium (Li), ytterbium (Yb), or lithium fluoride (LiF). In addition, the second electrode 24 may be made of, for example, a magnesium-copper (Mg—Cu) alloy, a magnesium-silver (Mg—Ag) alloy, a sodium-potassium (Na—K) alloy, an astatine-astatine oxide (At—$AtO_2$) alloy, a lithium-aluminum (Li—Al) alloy, a lithium-calcium-aluminum (Li—Ca—Al) alloy, or a lithium fluoride-calcium-aluminum (LiF—Ca—Al) alloy. In addition, the second electrode 24 may be made of, for example, an electrically conductive oxide such as tin oxide (SnO), zinc oxide (ZnO), indium tin oxide (ITO), or indium zinc oxide (IZO). In addition, the second electrode 24 may include a stack of layers of any of these materials. Note that examples of materials that have a small work function include magnesium (Mg), lithium (Li), lithium fluoride (LiF), magnesium-copper (Mg—Cu), magnesium-silver (Mg—Ag), sodium-potassium (Na—K), lithium-aluminum (Li—Al), lithium-calcium-aluminum (Li—Ca—Al), and lithium fluoride-calcium-aluminum (LiF—Ca—Al).

The sealing film 40, as shown in FIG. 10, is provided so as to cover the second electrode 24, includes a first inorganic sealing film 36, an organic sealing film 37, and a second inorganic sealing film 38, all of which are stacked on the second electrode 24 in the stated order, and has a function of protecting the organic EL layer 23 in the organic EL element 25 from, for example, water and oxygen. Here, the first inorganic sealing film 36 and the second inorganic sealing film 38 are made of, for example, an inorganic insulation film such as a silicon nitride film, a silicon oxide film, or a silicon oxynitride film. In addition, the organic sealing film 37 is made of, for example, an organic resin material such as acrylic resin, epoxy resin, silicone resin, polyurea resin, parylene resin, polyimide resin, or polyamide resin.

In addition, the organic EL display panel 50a (organic EL display device 70a), as shown in FIG. 1, includes, in the frame area F: a first damming wall Wa provided like a frame outside the trench G; and a second damming wall Wb provided like a frame around the first damming wall Wa.

The first damming wall Wa and the second damming wall Wb are arranged by stacking a plurality of resin layers so as to, for example, stack a resin layer made of the same material and in the same layer as the planarization film 19 and a resin layer made of the same material and in the same layer as the edge cover. Note that the first damming wall Wa is provided so as to overlap the peripheral end portion of the organic sealing film 37 of the sealing film 40 and structured to restrain ink that will form the organic sealing film 37 from spreading.

In addition, the organic EL display panel 50a (organic EL display device 70a), as shown in FIG. 1, includes, in the frame area F, a first frame line 18h provided inside the trench G like a frame as the second wiring layer 18 in such a manner that both end regions of the opening of the trench G reach the terminal section T. Here, the first frame line 18h is arranged so as to electrically connect to the first power supply line 18g on the display area D side of the frame area F and to be fed with a high-voltage power supply (ELVDD) through the terminal section T.

In addition, the organic EL display panel 50a (organic EL display device 70a), as shown in FIG. 1, in the frame area F, is shaped generally like a C as the second wiring layer 18 outside the trench G and includes a second frame line 18i that has two end regions reaching the terminal section T. Here, the second frame line 18i is arranged, for example, so as to electrically connect to the second electrode 24 via the conductive layer in the trench G and to be fed with a low-voltage power supply (ELVSS) through the terminal section T.

In the organic EL display panel 50a structured as above, in each subpixel P, first, when an associated one of the light-emission control lines 14e is selected and deactivated, the organic EL element 25 stops emitting light. In this non-light-emitting state, by selecting an associated one of the gate lines 14g (one of the gate lines 14g that is electrically connected to the first initialization TFT 9a and the second initialization TFT 9g) and feeding a gate signal to the first initialization TFT 9a via that gate line 14g, the first initialization TFT 9a and the second initialization TFT 9g are turned on, and the voltage on an associated one of the initialization power supply lines 16i is fed to the capacitor 9h, as well as the drive TFT 9d is turned on. Hence, the electric charge in the capacitor 9h is discharged, and the voltage on the control terminal (first gate electrode) 14a of the drive TFT 9d is initialized. Next, by selecting and activating an associated one of the gate lines 14g (one of the gate lines 14g that is electrically connected to the threshold-voltage compensation TFT 9b and the write control TFT 9c), the threshold-voltage compensation TFT 9b and the write control TFT 9c are turned on, and a prescribed voltage associated with a source signal transmitted via an associated one of the source lines 18f is written to the capacitor 9h via the drive TFT 9d in diode-connected state, as well as an initialization signal is applied to the first electrode 21 of the organic EL element 25 via an associated one of the initialization power supply lines 16i, and the electric charge stored in the first electrode 21 is reset. Thereafter, an associated one of the light-emission control lines 14e is selected, the power supply TFT 9e and the light-emission control TFT 9f are turned on, and a drive current in accordance with the voltage on the control terminal (gate electrode) 14a of the drive TFT 9d is fed from an associated one of power supply lines 18g to the organic EL element 25. In this manner, in an organic EL display-device panel 50a, in each subpixel P, the organic EL element 25 emits light with a luminance in accordance with drive current, to produce an image display.

A description will be given next of a method of manufacturing the organic EL display device 70*a* in accordance with the present embodiment. Note that the method of manufacturing the organic EL display device 70*a* in accordance with the present embodiment includes a TFT layer forming step, an organic EL element layer forming step, and a sealing film forming step.

TFT Layer Forming Step

The TFT layer 20*a* is formed by forming, for example, the base coat film 11, the first initialization TFTs 9*a*, the threshold-voltage compensation TFTs 9*b*, the write control TFTs 9*c*, the drive TFTs 9*d*, the power supply TFTs 9*e*, the light-emission control TFTs 9*f*, the second initialization TFTs 9*g*, the capacitors 9*h*, and the planarization film 19, for example, on the surface of the resin substrate layer 10 formed on a glass substrate by well-known techniques.

Organic EL Element Layer Forming Step

The organic EL element layer 30 is formed by forming, for example, the light-reflective, first electrodes 21, the edge cover, the organic EL layer 23 (the hole injection layer 1, the hole transport layer 2, the light-emitting layer 3, the electron transport layer 4, and the electron injection layer 5), and the light-transmissive, second electrode 24 on the planarization film 19 of the TFT layer 20*a* formed in the aforementioned TFT layer forming step by well-known techniques.

Sealing Film Forming Step

First, the first inorganic sealing film 36 is formed by forming, for example, an inorganic insulation film such as a silicon nitride film, a silicon oxide film, or a silicon oxynitride film by plasma CVD using a mask on the surface of the substrate including the organic EL element layer 30 formed in the aforementioned organic EL element layer forming step.

Subsequently, the organic sealing film 37 is formed by forming a film of an organic resin material such as acrylic resin by, for example, inkjet technology on the surface of the substrate on which the first inorganic sealing film 36 has been formed.

Thereafter, the sealing film 40 is formed by forming the second inorganic sealing film 38 by forming an inorganic insulation film such as a silicon nitride film, a silicon oxide film, or a silicon oxynitride film by plasma CVD using a mask on the substrate on which the organic sealing film 37 has been formed.

Then, after a protection sheet (not shown) is attached to the surface of the substrate on which the sealing film 40 has been formed, the glass substrate is detached from the bottom face of the resin substrate layer 10 by projecting a laser beam from the glass substrate side of the resin substrate layer 10, and furthermore, a protection sheet (not shown) is attached to the bottom face of the resin substrate layer 10 from which the glass substrate has been detached.

The organic EL display panel 50*a* in accordance with the present embodiment can be manufactured as described in the foregoing. Thereafter, the organic EL display device 70*a* in accordance with the present embodiment can be manufactured by mounting the image capturing unit 60 in such a manner that the image capturing unit 60 such as a camera is positioned on the backside of the image capturing area Dc of the organic EL display panel 50*a* when the organic EL display panel 50*a* is fixed to, for example, the interior of the housing.

As described above, since according to the organic EL display device 70*a* in accordance with the present embodiment, in a plan view, the plurality of initialization power supply lines 16*i* overlap the plurality of gate lines 14*g* respectively in the image capturing area Dc overlapping the image capturing unit 60 in the display area D, it is possible to increase the area of the portions available for image displays in each subpixel P provided in the image capturing area Dc. Since the aperture ratio of each subpixel P provided in the image capturing area Dc improves by this, it is possible to improve the optical transmittance of the image capturing area Dc in which the image capturing unit 60 is provided.

Second Embodiment

Figure 12:
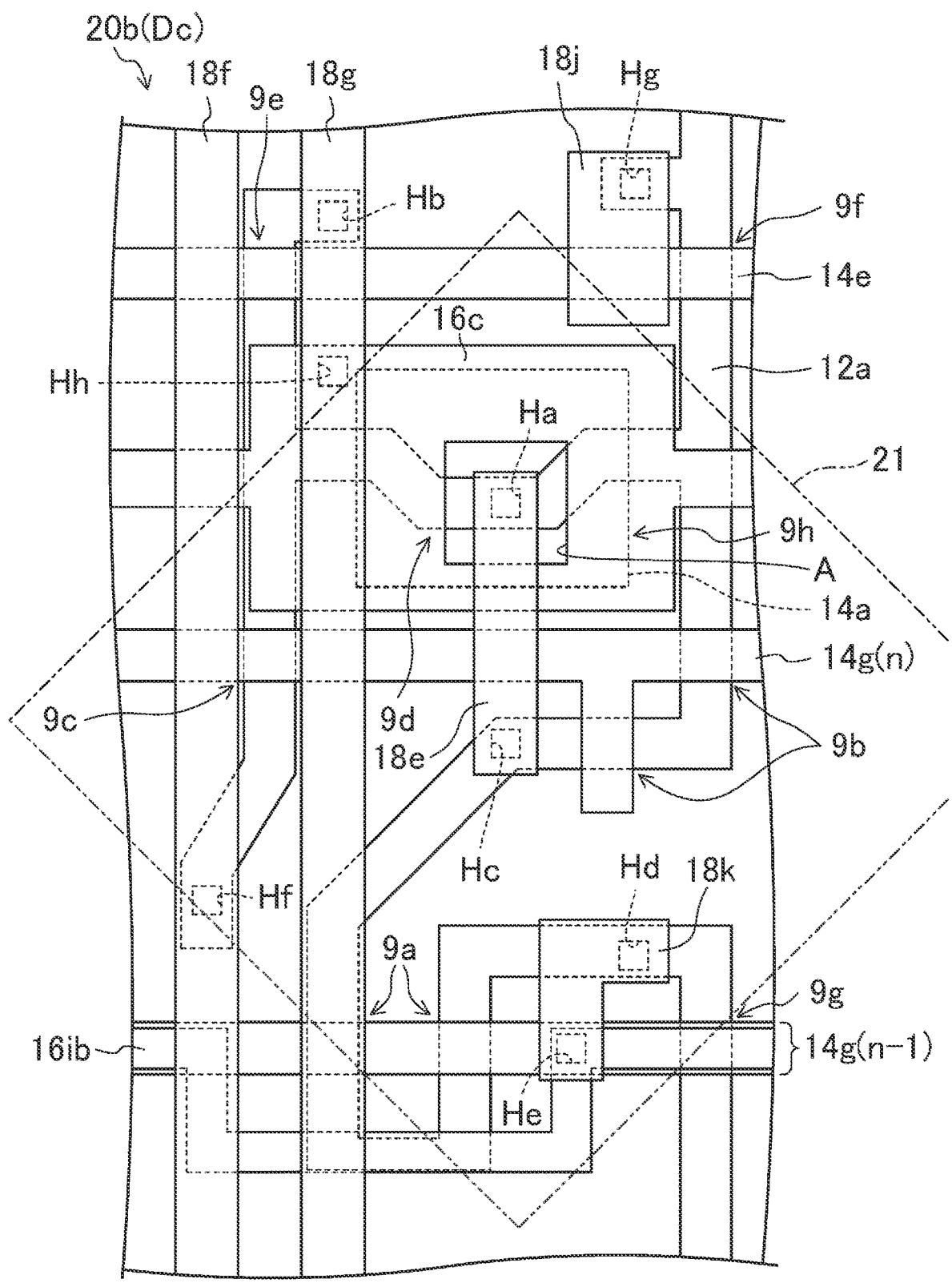
FIG. 12 is a plan view of an image capturing area of a TFT layer of an organic EL display panel in an organic EL display device in accordance with a second embodiment of the disclosure.

FIG. 12 represents a second embodiment of the display device in accordance with the disclosure. Here, FIG. 12 is a plan view of an image capturing area Dc of a TFT layer 20*b* in an organic EL display panel of an organic EL display device in accordance with the present embodiment. Note that throughout the following embodiments, the same portions as in FIGS. 1 to 11 are indicated by the same reference numerals, and description thereof is omitted.

In the first embodiment above, the organic EL display panel 50*a* (organic EL display device 70*a*) including the TFT layer 20*a* provided in such a manner that the gate lines 14*g* and the initialization power supply lines 16*i* overlap in the image capturing area Dc was described as an example. In contrast, in the present embodiment, an organic EL display panel (organic EL display device) including the TFT layer 20*b* provided in such a manner that the gate lines 14*g* and some of the initialization power supply lines 16*ib* (equivalents of the initialization power supply lines 16*i*) overlap in the image capturing area Dc is described as an example.

The organic EL display device in accordance with the present embodiment includes TFT layer 20*b* in place of the TFT layer 20*a* included in the organic EL display panel 50*a* in accordance with the first embodiment above and is otherwise structured in the same manner as the organic EL display device 70*a*.

In the TFT layer 20*b*, as shown in FIG. 12, in the image capturing area Dc, there are portions where the gate lines 14*g* and the initialization power supply lines 16*ib* do not overlap each other in an area overlapping the first electrodes 21, as well as the gate lines 14*g* and the initialization power supply lines 16*ib* overlap each other in an area not overlapping the first electrodes 21. The TFT layer 20*b* is otherwise structured in substantially the same manner as the TFT layer 20*a*.

As described above, since according to the organic EL display device including the TFT layer 20*b* in accordance with the present embodiment, in a plan view, the plurality of initialization power supply lines 16*ib* have, in the image capturing area Dc overlapping the image capturing unit 60 in the display area D, portions respectively overlapping the plurality of gate lines 14*g*, it is possible to increase the area of the portions available for image displays in each subpixel P provided in the image capturing area Dc. Since the aperture ratio of each subpixel P provided in the image capturing area Dc improves by this, it is possible to improve the optical transmittance of the image capturing area Dc in which the image capturing unit 60 is provided.

In addition, according to the organic EL display device including the TFT layer 20*b* in accordance with the present embodiment, since in the area overlapping the light-reflective, first electrodes 21 in the image capturing area Dc, there are portions where the gate lines 14*g* and the initialization power supply lines 16*ib* do not overlap each other, the parasitic capacitance between the gate lines 14*g* and the initialization power supply lines 16*ib* decreases, and the signal delays due to the gate lines 14g and the initialization power supply lines 16ib can be restrained.

Other Embodiments

Although in each embodiment above, an organic EL layer that has a five-layered structure including a hole injection layer, a hole transport layer, a light-emitting layer, an electron transport layer, and an electron injection layer was described as an example, the organic EL layer may have, for example, a three-layered structure including a hole injection and transport layer, a light-emitting layer, and an electron transport and injection layer.

In addition, although in each embodiment above, an organic EL display device including the first electrode as an anode and the second electrode as a cathode was described as an example, the disclosure is equally applicable to organic EL display devices in which the layered structure of the organic EL layer is reversed, so that the first electrode is a cathode and the second electrode is an anode.

In addition, although in each embodiment above, an organic EL display device in which the electrode of the TFT connected to the first electrode is a drain electrode was described as an example, the disclosure is equally applicable to organic EL display devices in which the electrode of the TFT connected to the first electrode is referred to as the source electrode.

In addition, although in each embodiment above, the organic EL display device was taken as an example of the display device, the disclosure is applicable to display devices including a plurality of current-driven light-emitting elements, For instance, display devices including QLEDs (quantum-dot light-emitting diodes) that are light-emitting elements using a quantum-dot layer.

INDUSTRIAL APPLICABILITY

As described above, the disclosure is useful in flexible display devices.

The invention claimed is:

1. A display device comprising:
   a display panel including:
      a base substrate;
      a thin film transistor layer provided on the base substrate and including a semiconductor layer, a gate insulation film, a plurality of first wiring lines, an interlayer insulation film, and a plurality of second wiring lines, all of which are stacked in a stated order;
      a light-emitting element layer provided on the thin film transistor layer and including a plurality of first electrodes, a plurality of functional layers, and a second electrode facing to the plurality of first electrodes and the plurality of functional layers, all of which are stacked in a stated order, in a manner corresponding to a plurality of subpixels included in a display area;
      a sealing film provided on the light-emitting element layer; and
      an image capturing area within the display area, wherein
   in a plan view, the plurality of second wiring lines, in an area overlapping the image capturing area, extends along the plurality of first wiring lines and has portions overlapping, respectively, the plurality of first wiring lines.

2. The display device according to claim 1, wherein in the plan view, the plurality of second wiring lines, in an area not overlapping the image capturing area, does not overlap, respectively, the plurality of first wiring lines.

3. The display device according to claim 1, wherein two end regions of a portion, where the plurality of first wiring lines and the plurality of second wiring lines overlap each other, are provided along an edge of the area overlapping the image capturing area.

4. The display device according to claim 1, wherein each of the plurality of first wiring lines has a width larger than a width of each of the plurality of second wiring lines.

5. The display device according to claim 1, wherein each of the plurality of first wiring lines has a width smaller than a width of each of the plurality of second wiring lines.

6. The display device according to claim 1, wherein
   the display area is rectangular, and
   in the plan view, the image capturing area is provided in an end region extending along a side of the display area.

7. The display device according to claim 1, wherein
   each of the plurality of first wiring lines is a gate line, and
   each of the plurality of second wiring lines is an initialization power supply line.

8. The display device according to claim 1, wherein
   the thin film transistor layer further includes:
      another interlayer insulation film provided on the plurality of second wiring lines,
      a plurality of third wiring lines provided on the other interlayer insulation film, and
      a planarization film provided on the plurality of third wiring lines, and each of the plurality of third wiring lines is a source line.

9. The display device according to claim 1, wherein each of the plurality of first wiring lines and each of the plurality of second wiring lines are made of a same material.

10. The display device according to claim 1, wherein each of the plurality of first electrodes is light-reflective.

11. The display device according to claim 1, wherein each the plurality of functional layers is an organic electroluminescence layer.

* * * * *